(12) United States Patent
Dyer et al.

(10) Patent No.: US 7,517,767 B2
(45) Date of Patent: Apr. 14, 2009

(54) FORMING CONDUCTIVE STUD FOR SEMICONDUCTIVE DEVICES

(75) Inventors: Thomas W. Dyer, Pleasant Valley, NY (US); Sunfei Fang, LaGrangeville, NY (US); Jiang Yan, Newburgh, NY (US)

(73) Assignees: International Business Machines Corporation, Armonk, NY (US); Infineon AG, Munich (DE)

( * ) Notice: Subject to any disclaimer, the term of this patent is extended or adjusted under 35 U.S.C. 154(b) by 0 days.

(21) Appl. No.: 11/559,574

(22) Filed: Nov. 14, 2006

(65) Prior Publication Data

US 2008/0111200 A1    May 15, 2008

(51) Int. Cl.
*H01L 21/336* (2006.01)
(52) U.S. Cl. ............... 438/303; 438/586; 257/E21.626; 257/E29.278
(58) Field of Classification Search ............ 438/589, 438/585, 586, 303, 304, 305, 597; 257/344, 257/382, E21.438, E21.435, E29.266, E21.433
See application file for complete search history.

(56) References Cited

U.S. PATENT DOCUMENTS

| | | | |
|---|---|---|---|
| 5,854,762 A | 12/1998 | Pascucci | |
| 6,180,472 B1 * | 1/2001 | Akamatsu et al. | 438/303 |
| 6,245,625 B1 * | 6/2001 | Gau | 438/305 |
| 6,551,334 B2 | 4/2003 | Blatter et al. | |
| 6,652,542 B2 | 11/2003 | Blatter et al. | |
| 6,726,694 B2 | 4/2004 | Blatter et al. | |
| 6,770,927 B2 * | 8/2004 | Cho et al. | 257/296 |
| 6,833,087 B2 | 12/2004 | Beck et al. | |
| 6,837,776 B2 | 1/2005 | Shimobeppu et al. | |

* cited by examiner

*Primary Examiner*—W. David Coleman
*Assistant Examiner*—Shaka Scarlett
(74) *Attorney, Agent, or Firm*—Yuanmin Cai

(57) ABSTRACT

Embodiments of the present invention provide a method of forming a conductive stud contacting a semiconductor device. The method includes forming a protective layer covering the semiconductor device; selectively etching an opening down through the protective layer reaching a contact area of the semiconductor device, the opening being away from a protected area of the semiconductor device; and filling the opening with a conductive material to form the conductive stud. One embodiment may further include forming a dielectric liner directly on top of the semiconductor device, and forming the protective layer on top of the dielectric liner. Embodiments of the present invention also provide a semiconductor device made thereof.

3 Claims, 18 Drawing Sheets

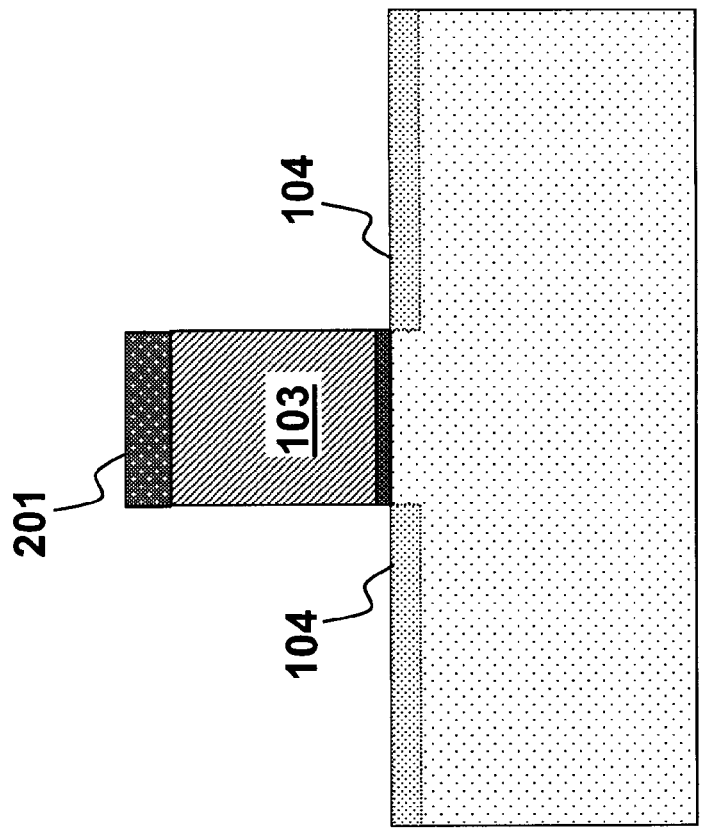
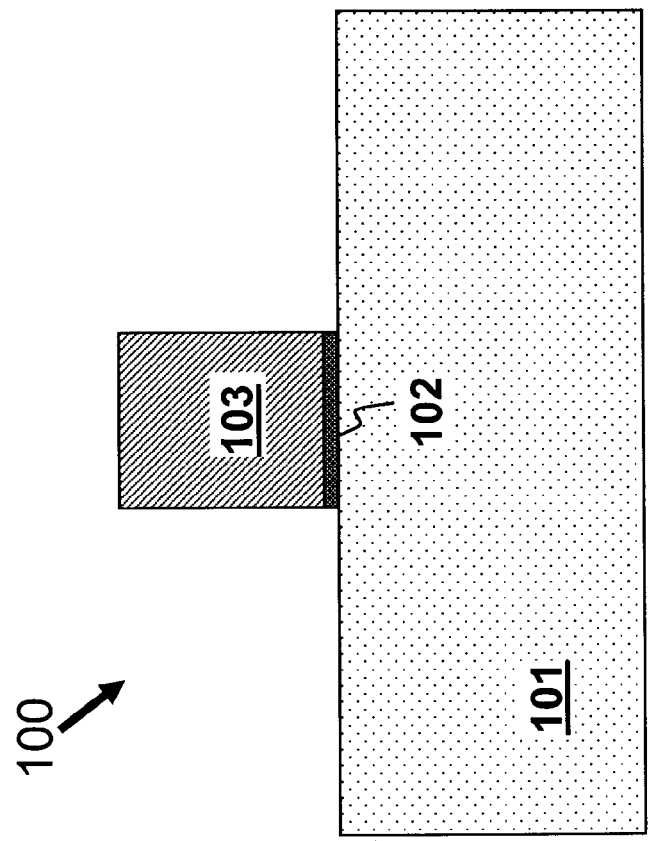
FIG. 5(a)
FIG. 5(b)

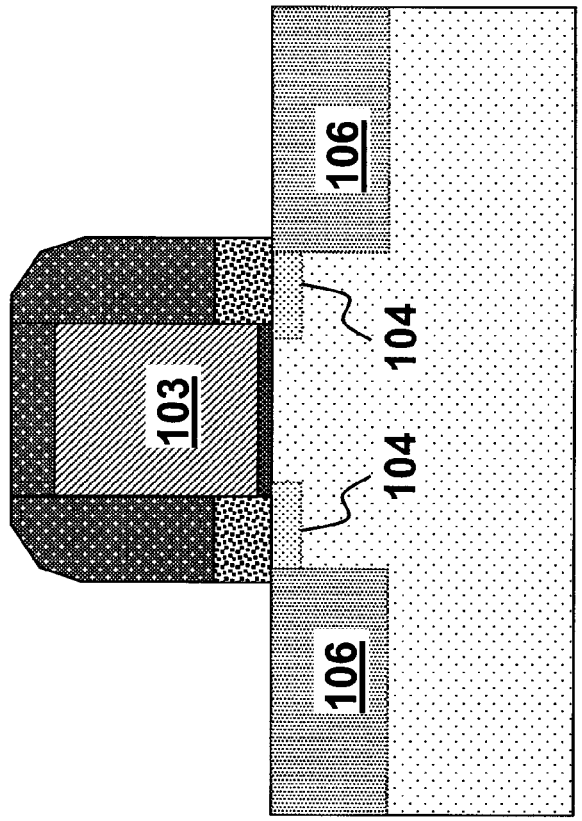
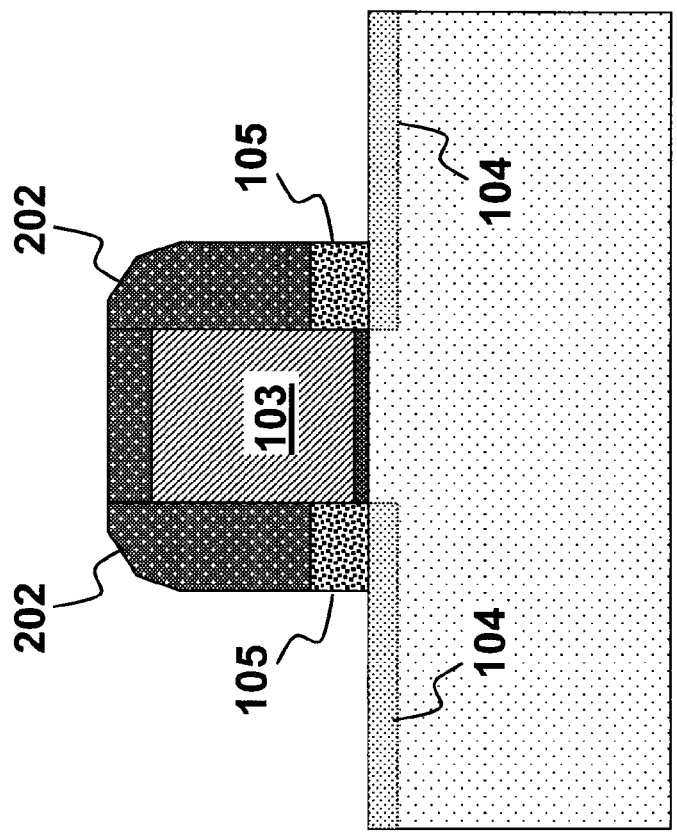
FIG. 5(f)
FIG. 5(e)

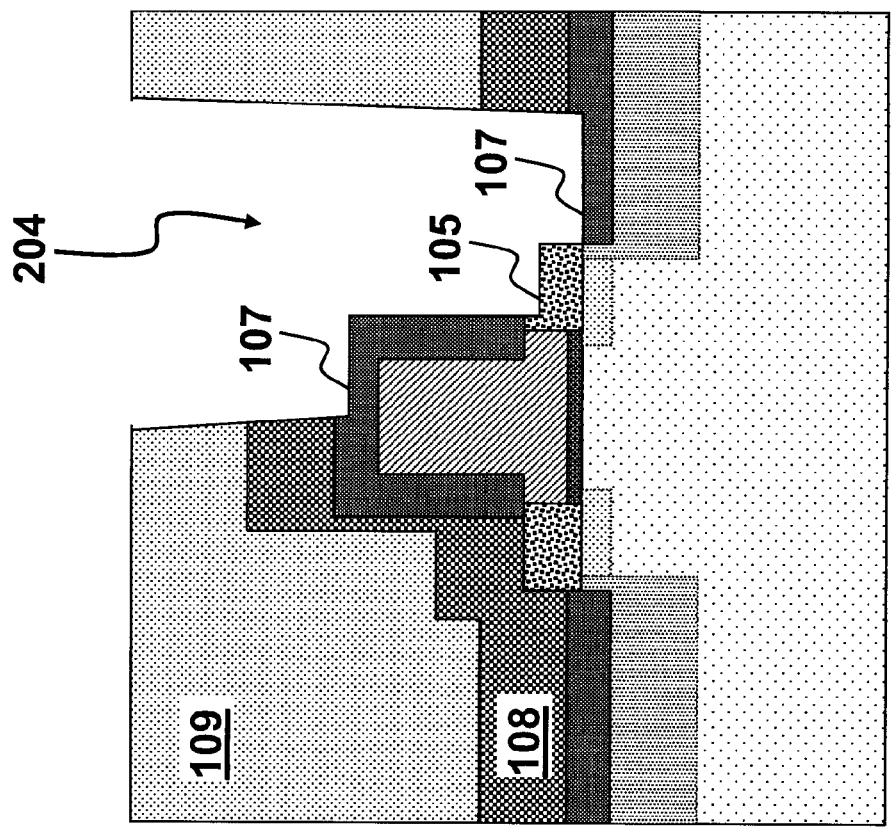
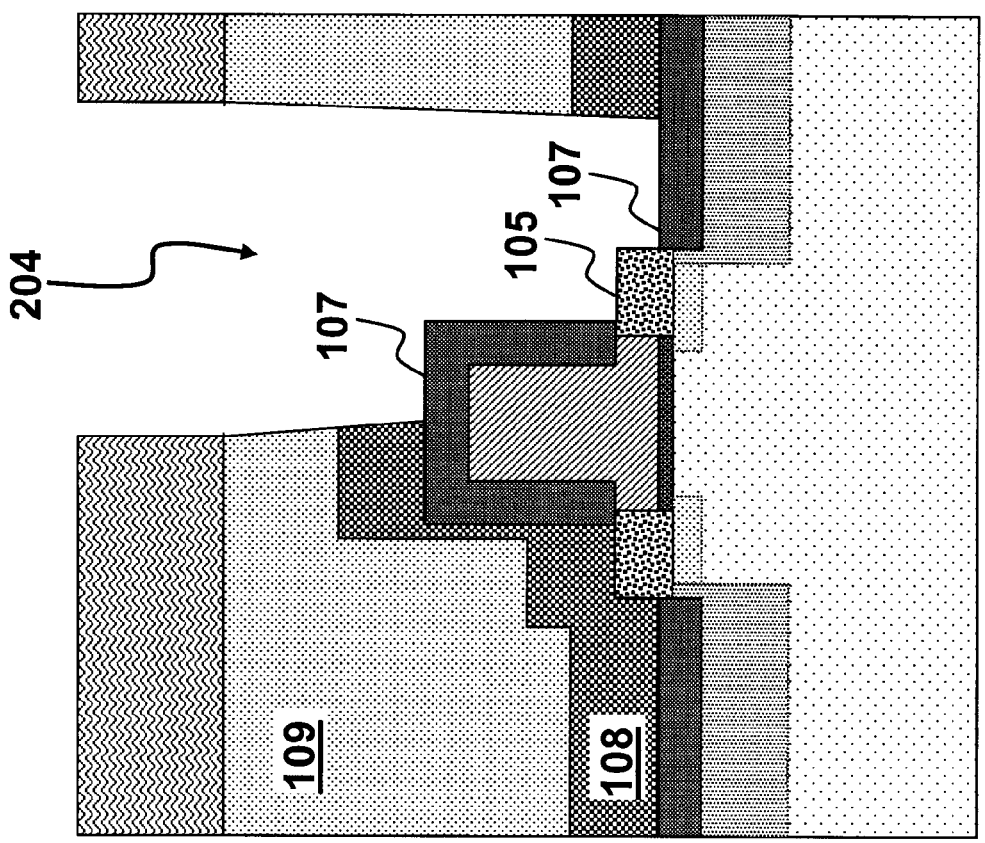

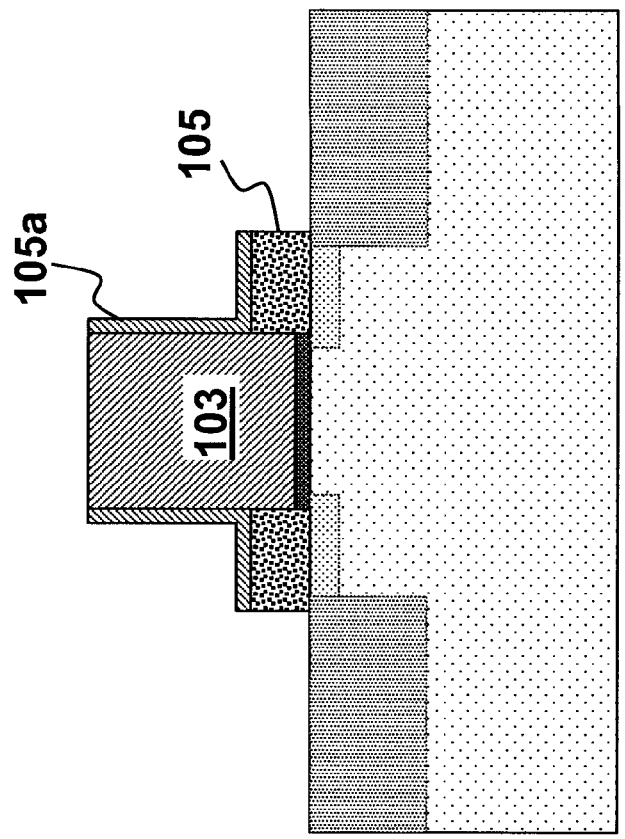
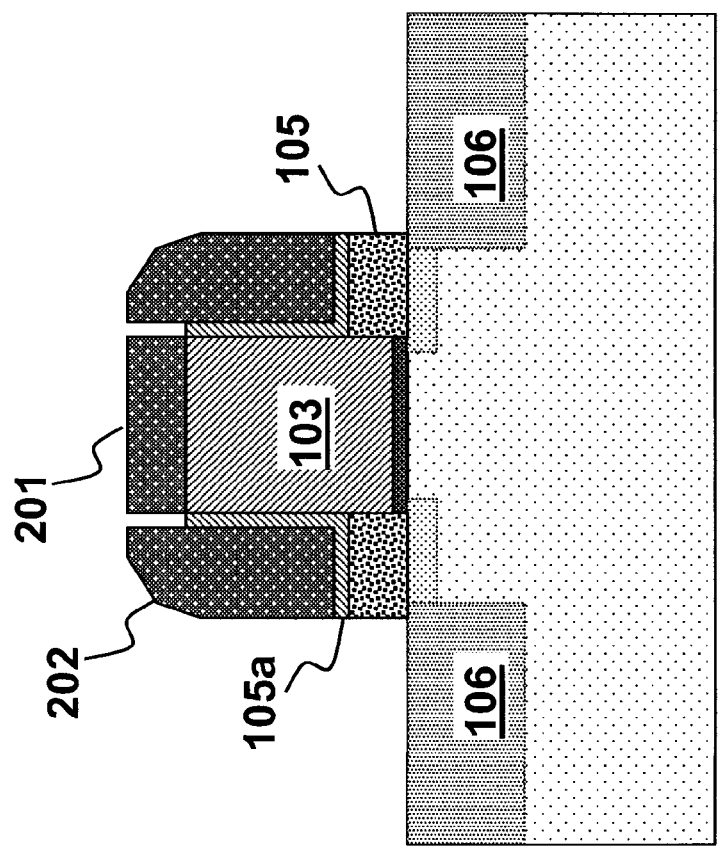
FIG. 6(f)
FIG. 6(e)

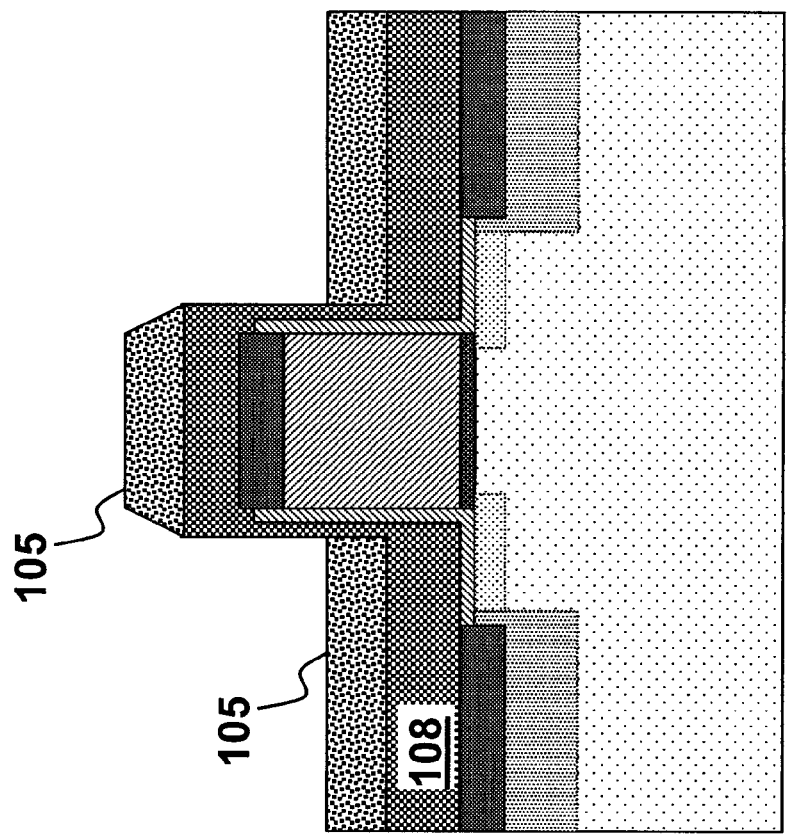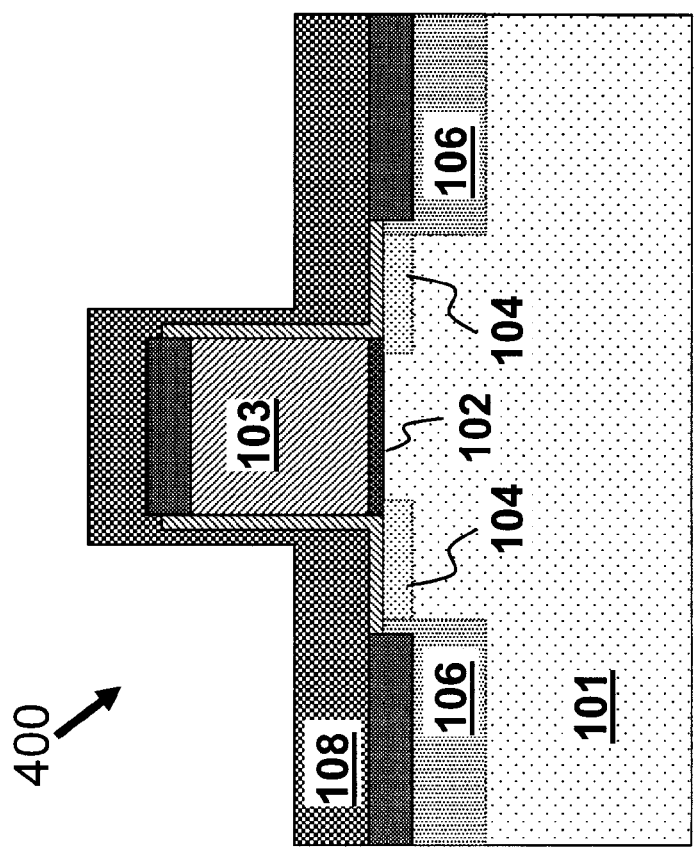
FIG. 7(a)
FIG. 7(b)

FORMING CONDUCTIVE STUD FOR SEMICONDUCTIVE DEVICES

FIELD OF THE INVENTION

The present invention relates to the field of semiconductor device manufacturing. In particular, it relates to methods and structures of forming conductive studs contacting source/drain regions of a semiconductor device without causing over-etch to source/drain extension regions of the same device.

BACKGROUND OF THE INVENTION

In the field of semiconductor device manufacturing, a semiconductor device such as, for example, a transistor or more specifically a complementary metal-oxide-semiconductor (CMOS) field-effect-transistor (FET) is normally manufactured or fabricated by well-known front end of line (FEOL) technologies. After the semiconductor device is formed, normally either tensile or compressive stress is induced into a channel region of the device, for example, by applying or depositing a dielectric stress liner covering the top of the semiconductor device. Introduction or induction of stress to the channel region of the device improves performance of the device by causing increased mobility of electronic charges, including electrons and/or holes, in the channel region.

As is well-known in the art, in order to improve the effectiveness of stress liners applied to a transistor, sidewall spacers of the transistor may be removed or at least partially removed (thin-down), before the stress liner is applied such that the stress liner may be disposed close enough to the channel region of the transistor, inducing bigger stress therein and achieving better performance. Following the application of the stress liner, one or more conductive studs may be subsequently created to provide electrical connections to contact areas of the source, drain, and/or gate regions of the transistor. Contacts to the source and/or drain regions are normally formed in silicided areas of the source/drain regions, adjacent to the source/drain extension regions of the transistor. Silicided areas of the source/drain regions may be silicided polysilicon, for example, nickel silicide (NiSi) for improved conductivity.

With continued scaling down in semiconductor device dimensions, source/drain regions of a transistor are becoming increasingly smaller, and thus contact areas thereupon are becoming more closer to source/drain extension regions, which are next to the gate region of the transistor. Consequently, source/drain extension regions are becoming more vulnerable to potential contact punch-through, sometimes also known as "over-etch", due to for example possible misalignment of openings in a process of forming contacts through conductive studs.

Therefore, there exists the need in the art to broaden process windows of forming conductive studs contacting source/drain regions of semiconductor devices such as transistors without causing punch-through or over-etch to adjacent source/drain extension regions.

SUMMARY OF THE INVENTION

Embodiments of the present invention provide a method of forming a conductive stud contacting a semiconductor device. The method includes forming a protective layer covering the semiconductor device; selectively etching an opening down through the protective layer reaching a contact area of the semiconductor device, the opening being away from a protected area of the semiconductor device; and filling the opening with a conductive material to form the conductive stud.

According to one embodiment, the method may also include forming one or more spacers adjacent to a gate region of the semiconductor device covering a first portion of the protective layer; removing a second portion not covered by the spacers to expose source/drain areas of the semiconductor device; forming source/drain regions at the exposed source/drain areas; and defining the protected area self-aligned to and covered by the first portion of the protective layer.

Next, the method may include removing the spacers and siliciding exposed areas of the gate and source/drain regions to form silicided contact area of the semiconductor device. Furthermore, the method may include applying a dielectric liner to cover the silicided contact area and the first portion of the protective layer; and depositing a layer of inter-level dielectric (ILD) over the dielectric liner, selectively etching through the ILD layer and the dielectric liner to create openings reaching the silicided contact area, with the protective layer protecting the protected area which may be a source/drain extension region.

According to another embodiment, the method may also include forming a thin layer of oxide covering the gate region of the semiconductor device before forming the spacers. The thin layer of oxide may protect the gate region from forming wrapped around silicided contact area as may be preferable in certain applications.

According to yet another embodiment, the method may include forming a dielectric liner directly on top of the semiconductor device, and forming the protective layer on top of the dielectric liner. Before the selectively etching, the method may include forming one or more spacers adjacent to a gate region of the semiconductor device; the spacers covering a first portion of the protective layer that is on top of the protected area. The protected area may be one or more source/drain extension regions.

Embodiments of the present invention also provide a semiconductor device, such as for example a field-effect transistor (FET). The semiconductor device may include a gate region; at least one source/drain region; at least one source/drain extension region situated between the gate region and the source/drain region; and a conductive stud contacting at least the source/drain region, wherein the conductive stud is not in contact with the source/drain extension region through separation by at least a portion of a protective layer applied on top of the source/drain extension region.

According to one embodiment, the semiconductor device may include a dielectric stress liner situated between the protective layer and the source/drain extension region. The protective layer is an oxide layer and the dielectric stress liner is a nitride compressive liner or a nitride tensile liner.

According to another embodiment, source/drain extension region of the semiconductor device may be covered directly by the protective layer, which is subsequently covered by a dielectric stress liner. The protective layer includes dielectric material that is selective to the dielectric stress liner in a selective etching process.

BRIEF DESCRIPTION OF THE DRAWINGS

The present invention will be understood and appreciated more fully from the following detailed description of the invention, taken in conjunction with the accompanying drawings of which:

FIGS. 6(a)-(h) are demonstrative illustrations of a method of forming conductive stud according to another embodiment of the present invention; and FIGS. 7(a)-(f) are demonstrative illustrations of a method of forming conductive stud according to yet another embodiment of the present invention.

Figure 1:
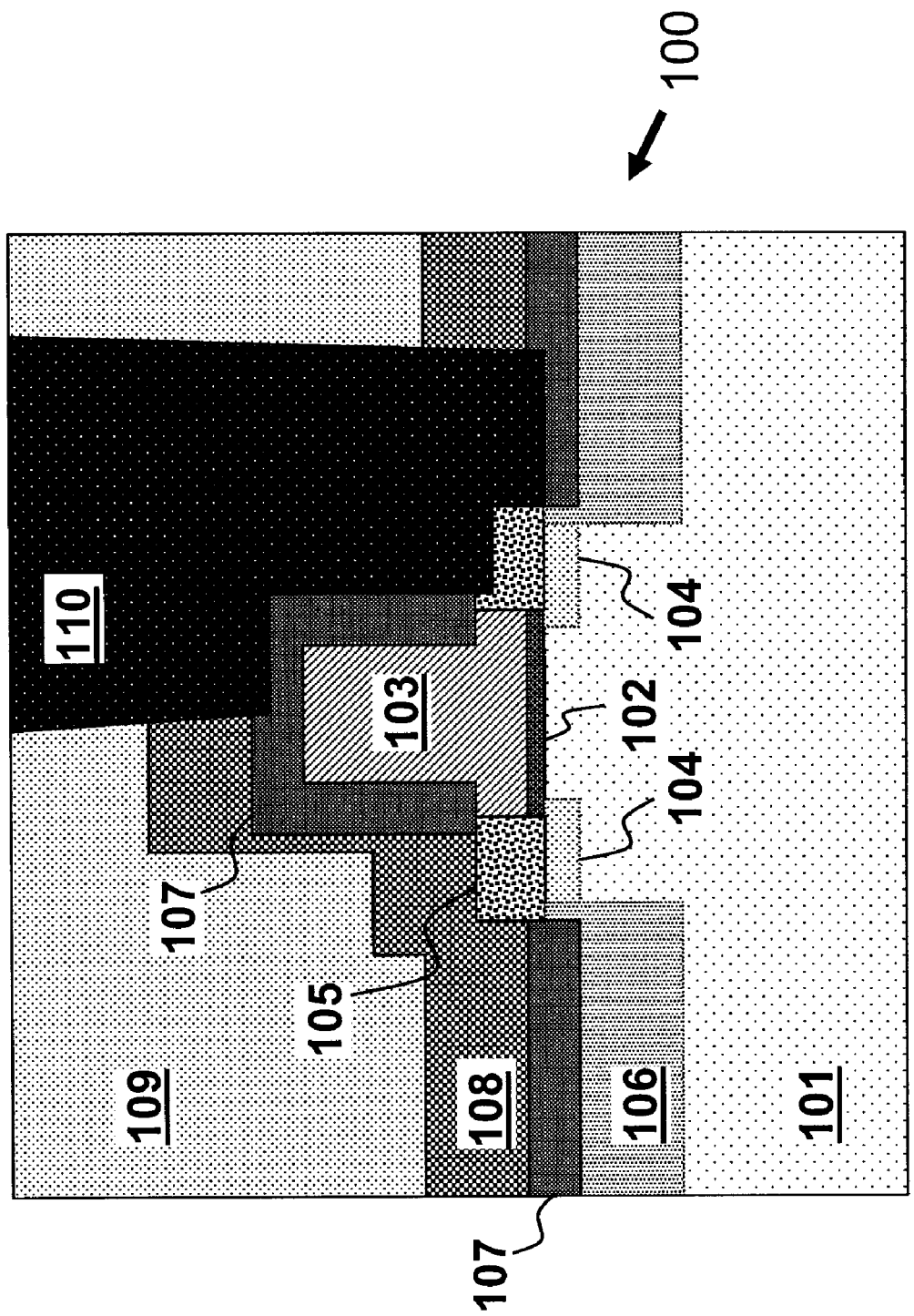
FIGS. 1-4 are demonstrative cross-sectional views of structures of semiconductor devices according to embodiments of the present invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of embodiments of the invention. However, it will be understood by those of ordinary skill in the art that embodiments of the invention may be practiced without these specific details. In the interest of not obscuring presentation of essences and/or embodiments of the present invention, in the following detailed description, processing steps and/or operations that are well known in the art may have been combined together for presentation and/or for illustration purpose and in some instances may not have been described in detail. In other instances, processing steps and/or operations that are well known in the art may not be described at all. A person skilled in the art will appreciate that the following descriptions have rather focused on distinctive features and/or elements of embodiments of the present invention.

In semiconductor manufacturing industry, various types of active semiconductor devices such as transistors, including CMOS field-effect-transistors of NFETs and PFETs, may be created or formed on a single substrate of a semiconductor chip by applying FEOL processing technologies. Well-known FEOL technologies may include processing steps and/or operations of, for example, cap deposition, photo-resist deposition, photolithography, hard-mask formation, wet etching, reactive-ion etching (RIE), ion-implantation, and chemical-mechanical polishing (CMP), to list a few. After the formation of transistors, stress liners of the same or different stress types may be applied to different types of transistors, i.e., NFETs and PFETs, for device performance improvement. Improvement in device performance may come from improved mobility of electrons in a channel region of the NFETs and/or holes in a channel region of the PFETs caused by induced channel stresses.

FIGS. 1-4 are demonstrative cross-sectional views of structures of semiconductor devices according to embodiments of the present invention. For example, FIG. 1 illustrates a semiconductor device 100, which may be a transistor such as for example a NFET or a PFET. Semiconductor device 100 may include a substrate 101 thereupon formed a gate dielectric 102 and a gate region 103 formed on top of gate dielectric 102, and source/drain regions 106 formed inside substrate 101. Functioning as electrical contact areas, top surfaces of gate region 103 and source/drain regions 106 may be salicidated to include a layer of silicide 107, for example NiSi, for good conductivity. According to one embodiment of the present invention, the contact area for gate region 103 may be wrapped around by silicide layer 107 for improved conductivity, but the invention is not limited in this respect.

One or more conductive studs may be formed to provide electrical connections to gate region 103 and/or source/drain regions 106. For example, FIG. 1 shows that a conductive stud 110 may act as a contact bar, and may be in contact with gate region 103 and source/drain region 106, through silicide layer 107. Conductive stud 110 may be formed inside and through an inter-level dielectric (ILD) layer 109, which may be deposited on top of a dielectric liner 108. Dielectric liner 108 may be a stress liner, for example a nitride stress liner, and more specifically may be a compressive stress liner or tensile stress liner. Stress liner 108 may be formed on top of gate region 103 and source/drain regions 106 to induce stresses inside the channel region of device 100, which typically includes a region underneath gate dielectric 102, for improved mobility of electronic charges such as electrons and/or holes.

As is known in the art, semiconductor device 100 may also include source/drain extension regions 104 disposed next to the channel region underneath gate dielectric 102 for advanced device performance. According to one embodiment of the present invention, source/drain extension regions 104 may be covered by a protective layer 105, which may be formed directly (FIGS. 1-3) or indirectly (FIG. 4) on top of source/drain extension regions 104. Protective layer 105 may thus provide protection for source/drain extension regions 104 from being etched or damaged during a process of creating openings for conductive stud 110.

Protective layer 105 may be made of dielectric material such as, for example oxide, but the present invention is not limited in this respect. Other dielectric materials that provide etching selectivity relative to surrounding materials, as described below in detail, may be used as well. Hereinafter, in reference to the shape and/or structures illustrated in FIGS. 1-4, protective layer 105 may also be referred to as a protective block 105 or a protective plug 105.

Figure 2:
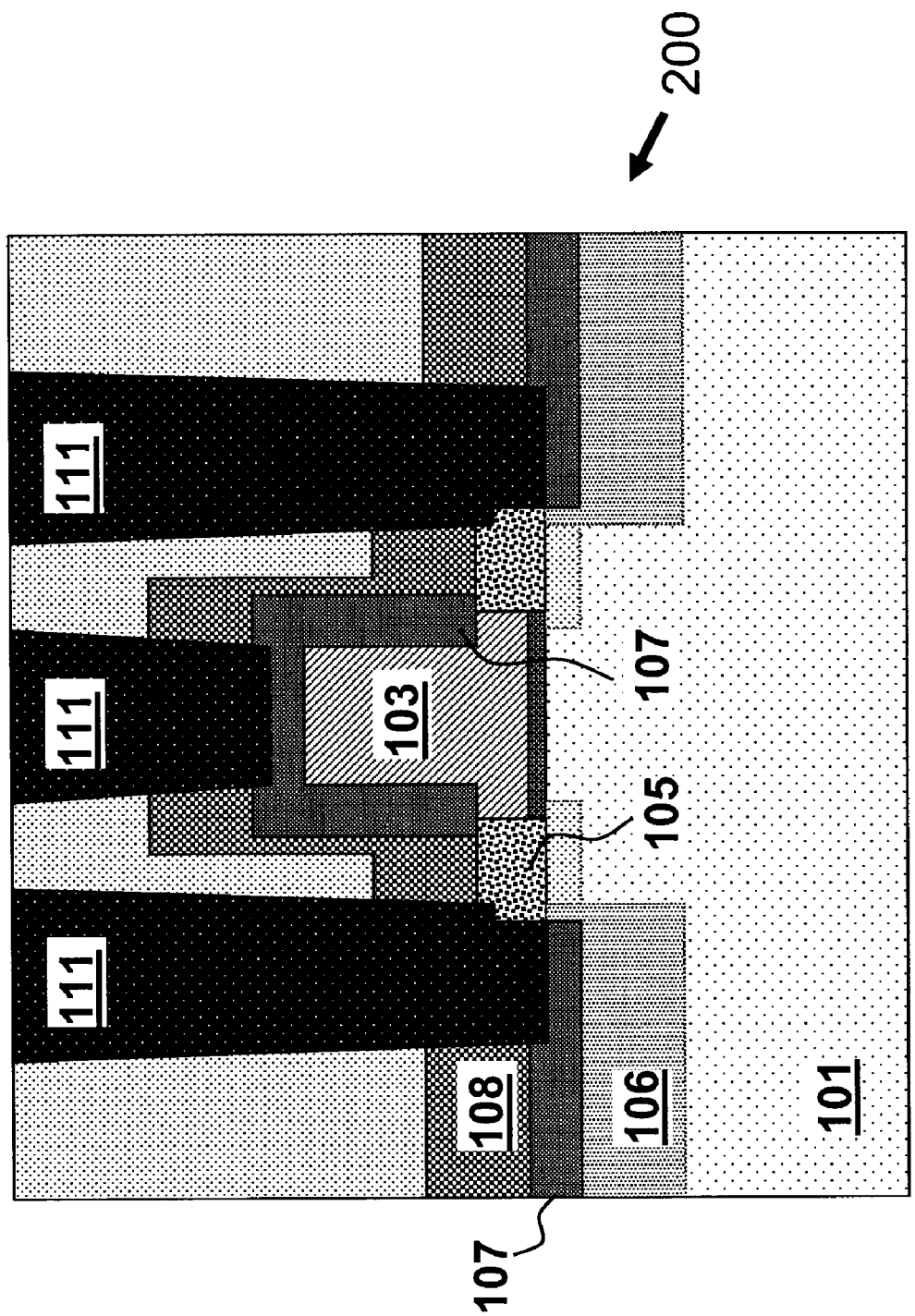

FIG. 2 illustrates a semiconductor device 200 according to another embodiment of the present invention. Instead of CA bar 110 as shown in FIG. 1, semiconductor device 200 may have a plurality of conductive studs 111 formed through inter-level dielectric layer 109 and stress liner 108. Conductive studs 111 provide electrical connections by being in contact with contact areas 107 of source/drain regions 106 and/or gate region 103.

According to embodiments of the present invention, the application or existence of protective layer 105, or protective block 105, or protective plug 105, may provide a relatively wide processing window for creating openings without causing etching, or "over-etch", into underneath source/drain extension regions 104 during the process of forming conductive studs 111. For example, a person skilled in the art will appreciate that certain lateral positional deviations of the openings created for conductive studs 111, either to the right or to the left, will not cause source/drain extension regions 104 being exposed because of the protection provided by protective block or plug 105.

Figure 3:
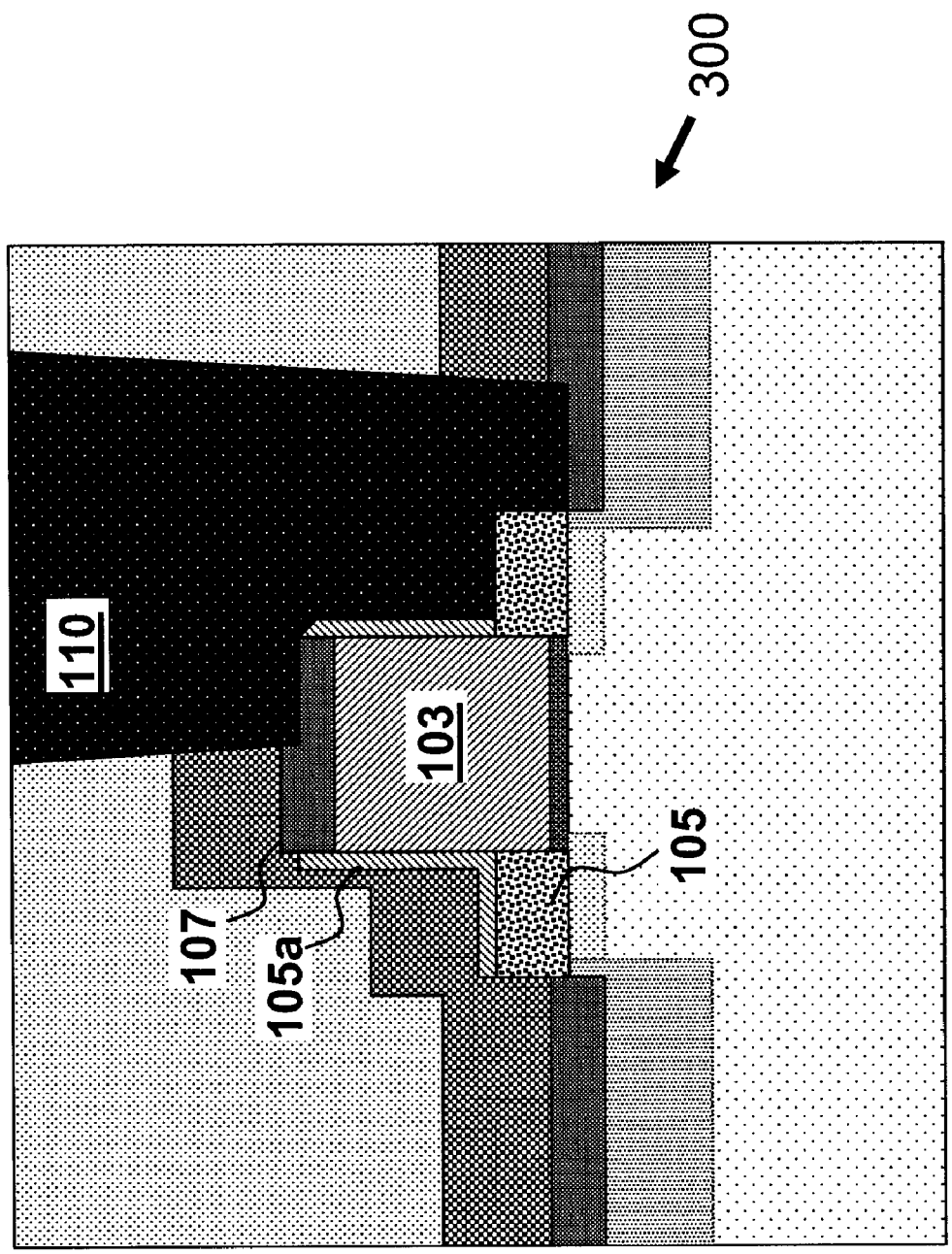

FIG. 3 illustrates a semiconductor device 300 according to yet another embodiment of the present invention. In contrary to semiconductor device 100, semiconductor device 300 may have a thin layer of dielectric material 105a deposited along sidewalls of gate region 103. Dielectric layer 105a may be for example a layer of oxide although other types of suitable dielectric materials may be used as well. Application of thin dielectric layer 105a may prevent sidewalls of gate region 103 from becoming silicided during a process of forming contact areas of gate region 103 and source/drain regions 106 through silicidation. In other words, only a top surface of gate region 103 may be silicided, which may be advantageous to certain applications.

Figure 4:
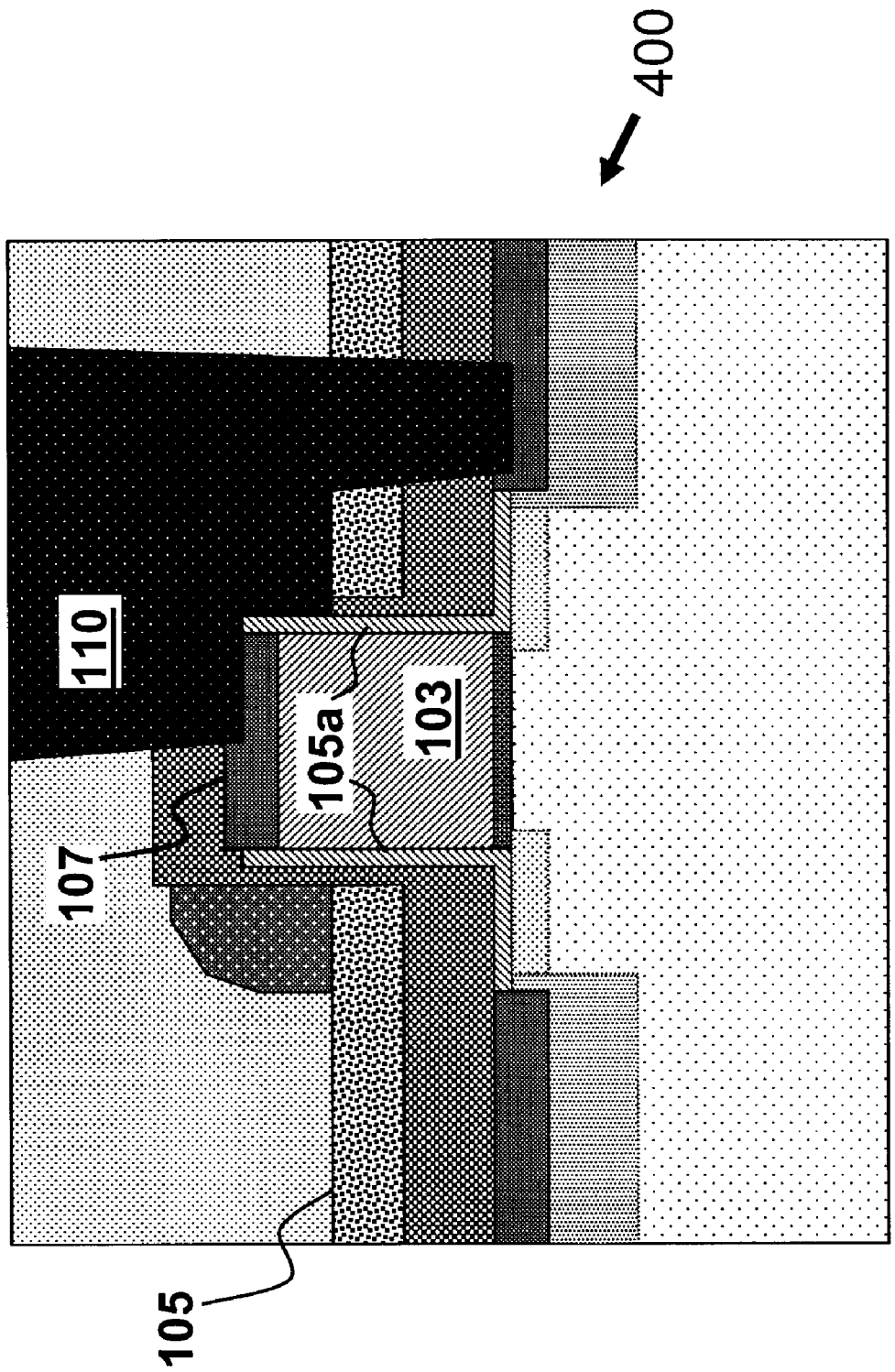

FIG. 4 illustrates a semiconductor device 400 according to a further embodiment of the present invention. In stead of a protective layer 105 formed directly on top of source/drain extension regions 104 as shown in FIGS. 1-3, FIG. 4 shows a semiconductor device 400 having a protective layer 105 formed on top of a dielectric liner 108, which in turn forms on top of source/drain extension regions 104. In other words, dielectric liner 108, which may be a nitride stress liner, may be first deposited directly on top of source/drain extension regions 104 for increased effectiveness of stress application. Protective layer 105 may then be deposited on top of stress liner 108 to protect source/drain extension regions 104. Electrical connections to device 400 may be made through conductive stud 110 formed in an opening that exposes gate region 103 and is also down through protective layer 105 and stress liner 108 reaching silicided contact area 107 of source/drain region 106. The opening may be subsequently filled with conductive materials such as, for example, tungsten (W). Conductive stud 110 may be away from source/drain extension regions 104 due to the protection of protective block or plug 105. In this application, source/drain extension regions 104 are areas requiring protection and therefore may be referred to hereinafter also as protected areas.

References are now made to FIGS. 5(a)-(n), which are simplified illustrations of methods, according to some embodiments of the present invention, of forming conductive stud contacting source/drain regions of a semiconductor device 100, for example a transistor. The formation of conductive stud may not cause etching, also known as "overetch", into protected areas of source/drain extension regions of semiconductor device 100.

FIG. 5(a) illustrates a structure 100 wherein a gate region 103 is defined on top of a semiconductor substrate 101 according to any of well-known FEOL technologies. Gate region 103 may be a polysilicon gate and may be formed on top of semiconductor substrate 101 via a gate dielectric 102, which may be for example an oxide or other suitable dielectric materials. FIG. 5(b) illustrates that on top of gate region 103, a layer of protective material 201, such as nitride for example, may be formed that protects gate region 103 in a following process of forming a lightly doped surface of substrate 101. The lightly doped surface of substrate 101 may be created through for example a shallow ion implantation, as is well-known in the art. A portion of the shallow ion implantation layer, in regions next to gate region 103, may form source/drain extension regions 104 in a follow-up source/drain formation process of deep ion implantation.

According to one embodiment of the present invention, following the formation of shallow ion implantation layer, a protective layer of dielectric material 105 may be deposited directly on top of the shallow ion implantation layer and protective layer 201 of gate region 103. As is shown in FIG. 5(c), dielectric material 105 may be a layer of oxide, and the oxide layer 105 may be deposited through, for example, a high-density plasma (HDP) process as is well-known in the art. The application of HDP process may create a non-conformal oxide layer 105 which provides a pre-determined or desired thickness on top of the region of shallow ion implantation and almost no coverage along sidewalls of gate region 103.

Figure 5D:
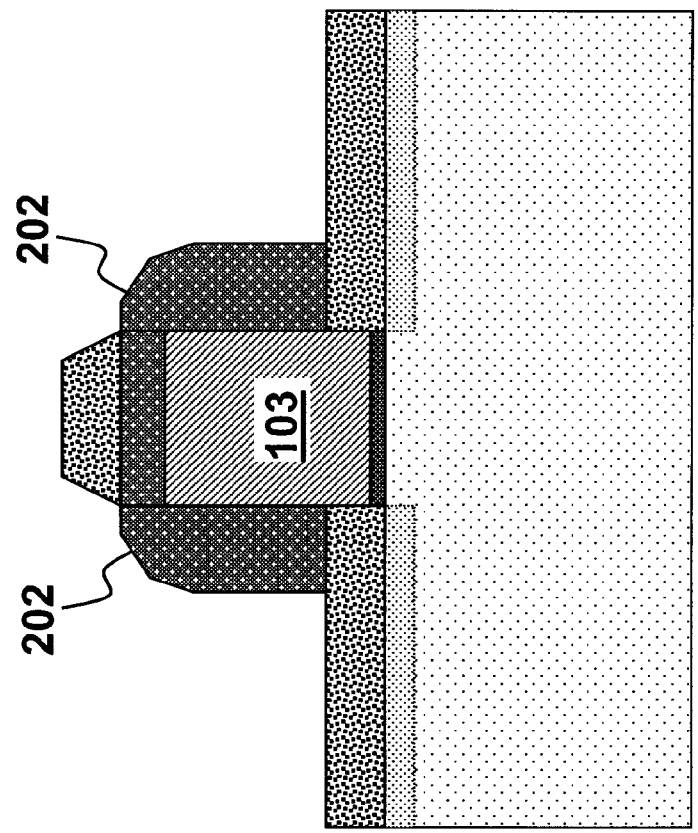
FIGS. 5(a)-(n) are demonstrative illustrations of a method of forming conductive stud according to one embodiment of the present invention.
Figure 5C:
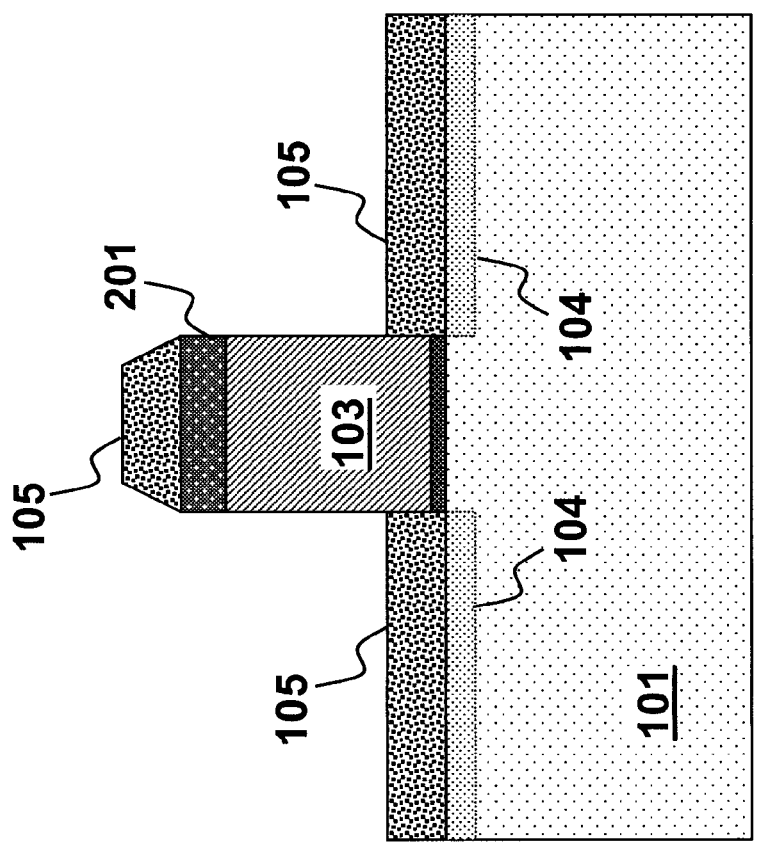

FIG. 5(d) illustrates a method of forming spacers along sidewalls of gate region 103 according to embodiments of the present invention. Spacers 202 may be materials of nitride that may be made selective to oxide of protective layer 105 during an etching process and may be formed by applying any of well-known FEOL technologies. Spacers 202 may define a region, not covered by spacers 202, where deep source/drain ion implantation may be performed in a subsequent operation to form source/drain regions. The uncovered regions of protective layer 105 may be selectively removed by any well-known etching process, such as a reactive-ion-etching (RIE) process, leaving the remaining protective layer 105 underneath spacers 202 to form protective plugs 105 or blocks 105, as shown in FIG. 5(e).

FIG. 5(f) illustrates that after forming protective plugs 105, exposed areas beside gate region 103 and not covered by spacers 202 may be subjected to a deep ion implantation process to form source/drain regions 106. The process of deep ion implantation may be followed by an annealing process which may result in a slight expansion of ions in source/drain regions 106 into source/drain extension regions 104 underneath spacer 202 as illustrated in FIG. 5(f).

As is clear from the description above, according to embodiments of the present invention, protective plugs 105 are thus self-aligned to the underneath source/drain extension regions 104, which are next to the formed source/drain regions 106 as is shown in FIG. 5(f). Protective plugs or blocks 105 provide protection for the source/drain extension regions 104 in a later process of forming conductive studs.

Figure 5H:
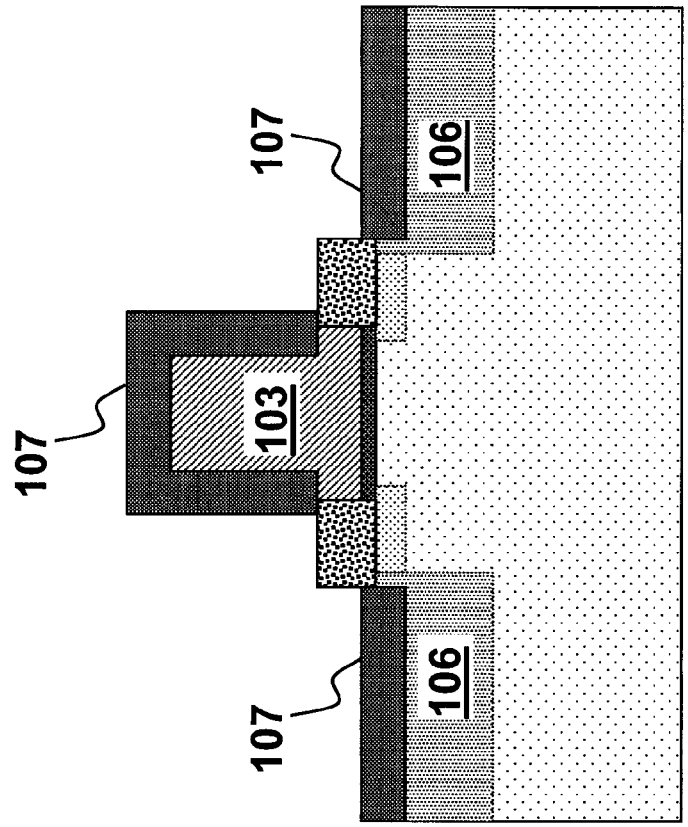
Figure 5G:
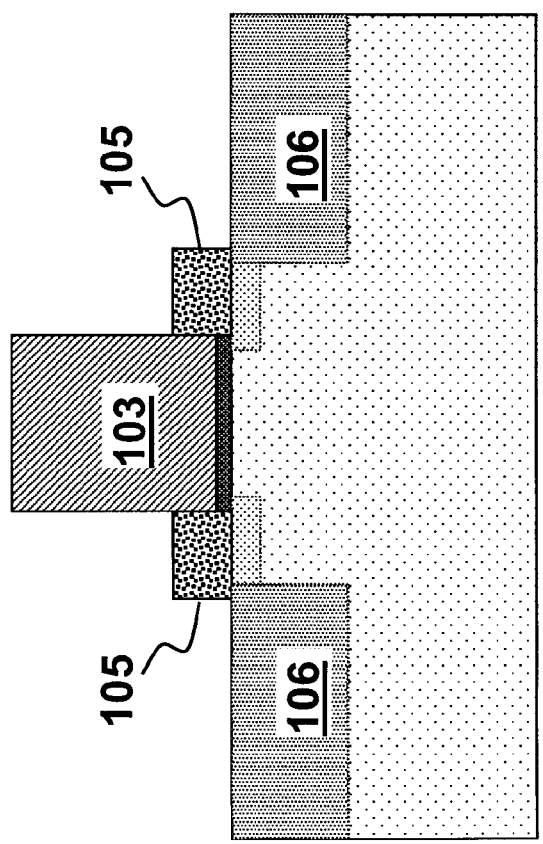

After forming source/drain regions 106 with the deep ion implantation process, FIG. 5(g) shows that nitride spacers 202 may be removed such that a stress liner may be applied close enough to gate region 103 and thus close to the channel region underneath dielectric layer 102. Nitride spacers 202 may be selectively etched away by applying the selectivity of nitride relative to oxide of protective layer 105 and polysilicon of gate region 103 and source/drain regions 106. Following the removal of nitride spacers 202, according to one embodiment, a layer of silicide 107 may be formed on top surfaces of source/drain regions 106 and around the exposed surface of gate region 103 as shown in FIG. 5(h). The formation of silicide 107 may be through depositing a layer of metal, such as nickel for example, on top of gate and source/drain regions 103 and 106 and then subject semiconductor device 100 to an annealing process. FIG. 5(h) illustrates that gate region 103 is wrapped around by nickel silicide 107. However, the present invention is not limited in this respect. According to one embodiment, nickel silicide may be formed only on the top surface of gate region 103, if so desired or predetermined, by applying a thin dielectric layer, for example oxide, on sidewalls of gate region 103 before the silicidation process, as described in detail with references to FIGS. 6(a)-(f) below. Silicide 107 provides a region of contact areas with reduced resistance and/or improved conductivity of source/drain and gate region.

Figure 5J:
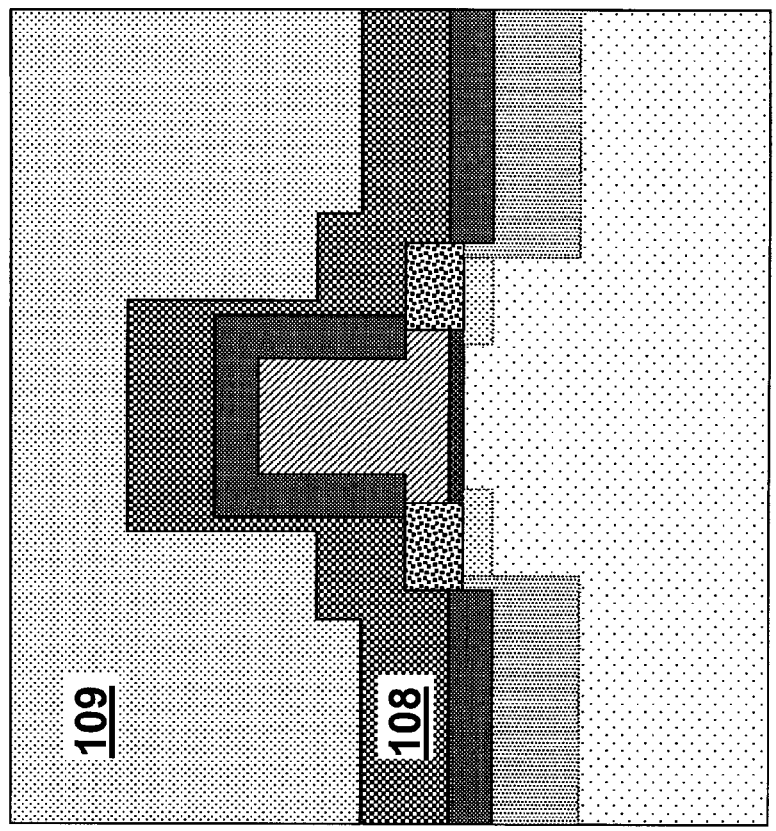
Figure 5I:
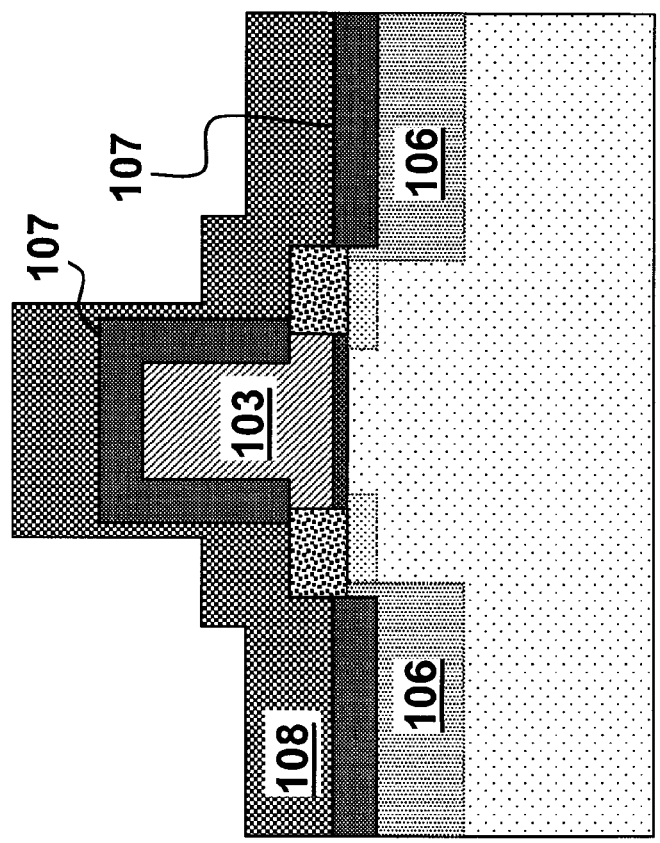
Figure 5L:
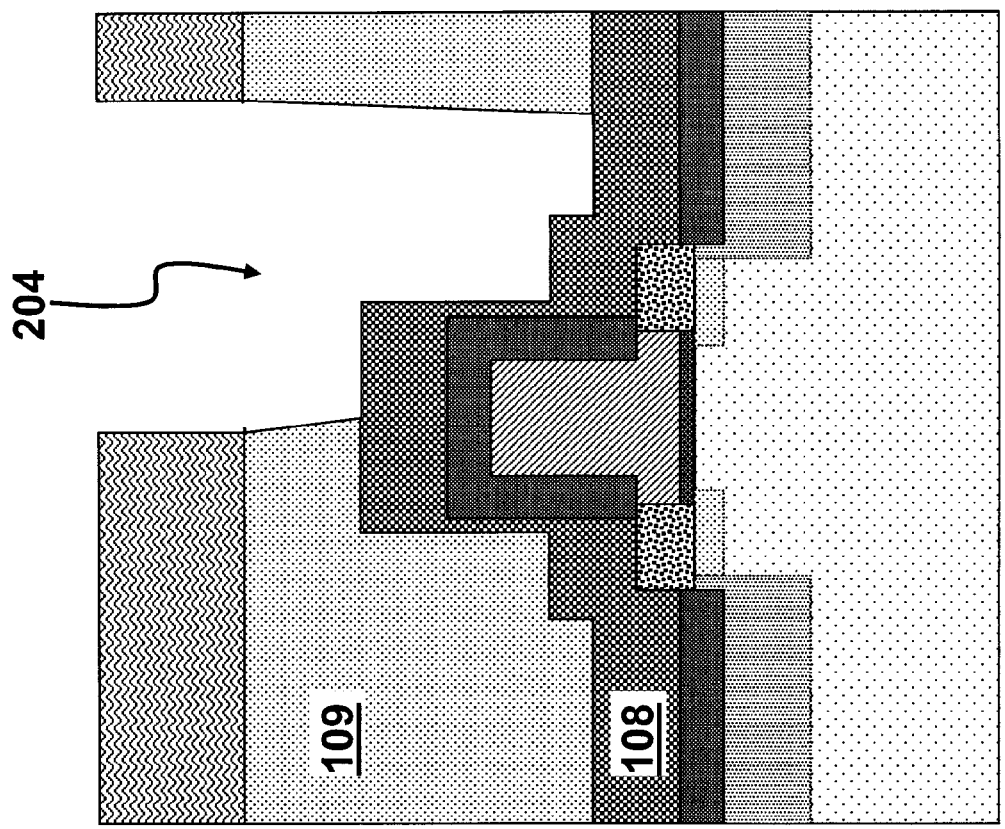
Figure 5K:
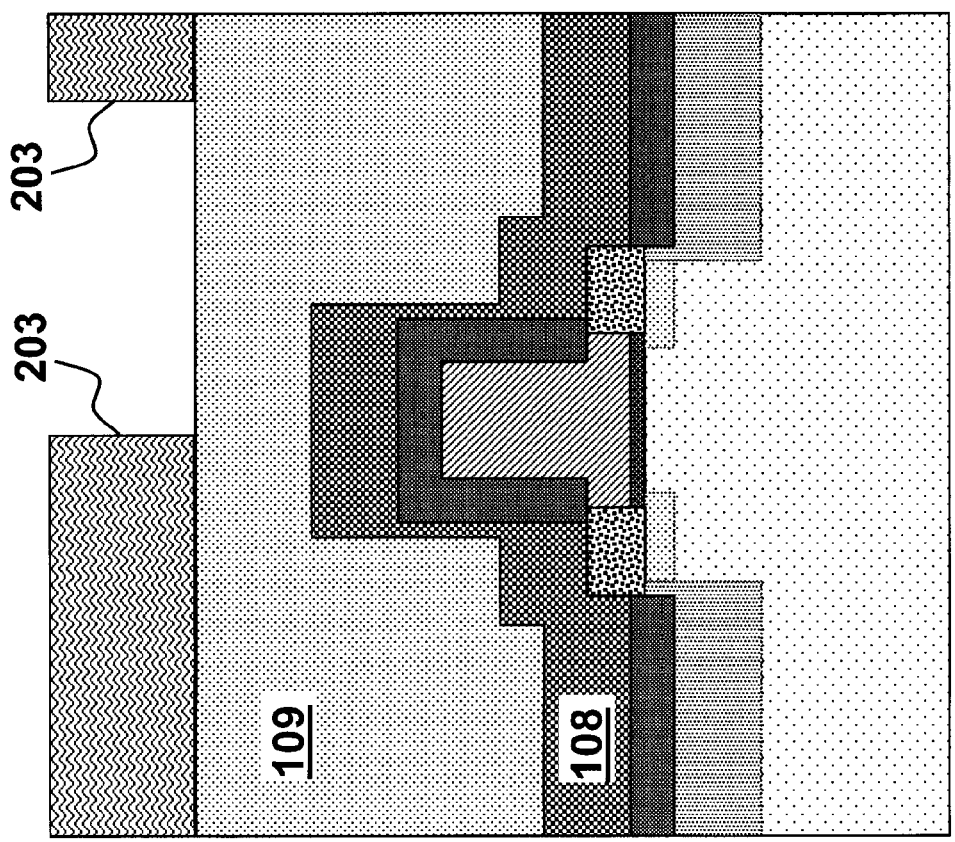
Figure 6B:
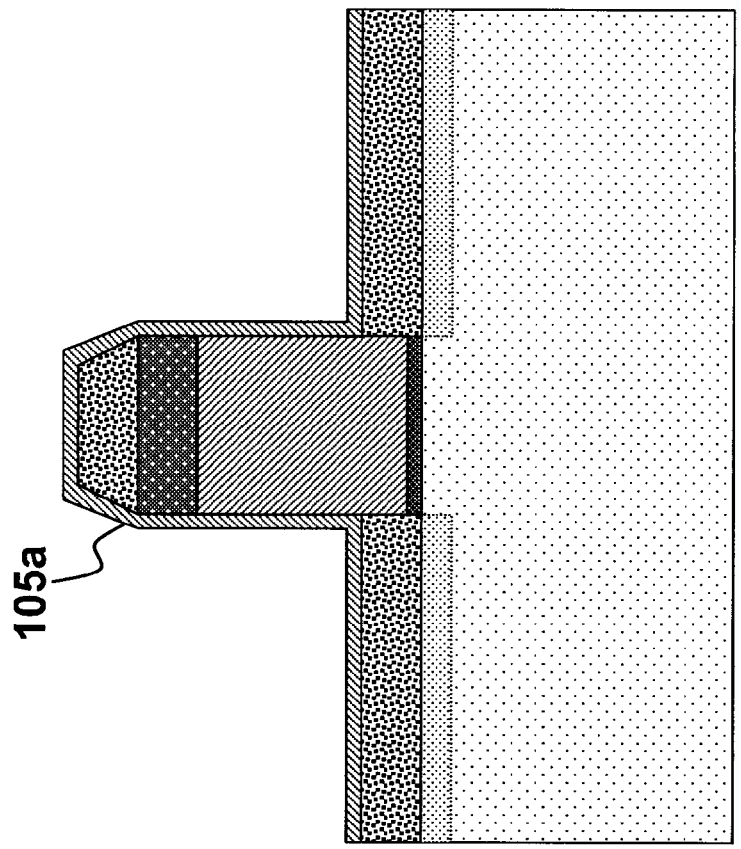
Figure 6A:
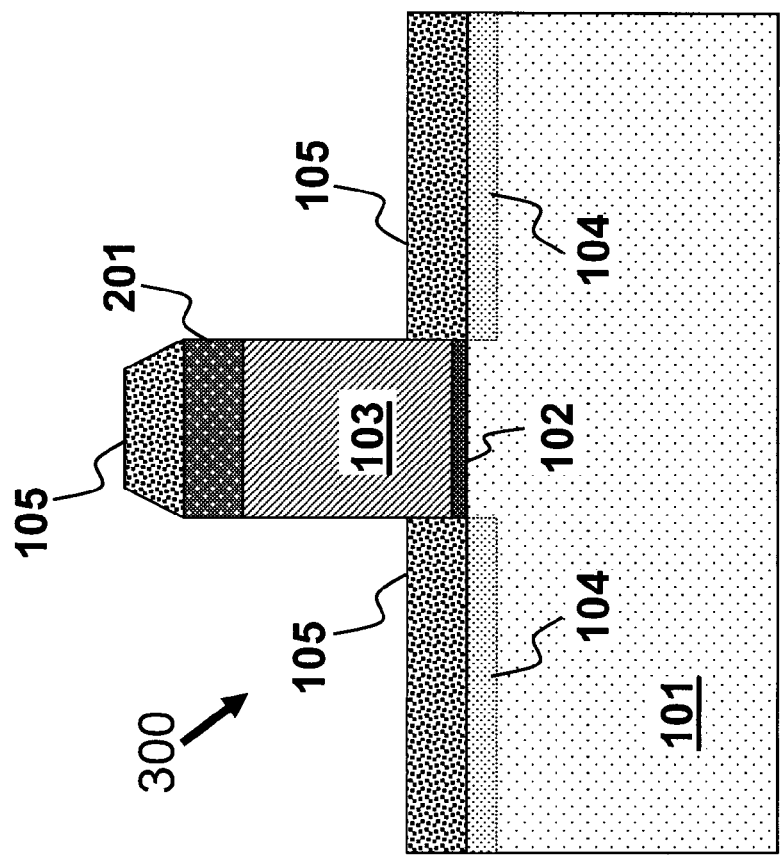
Figure 6C:
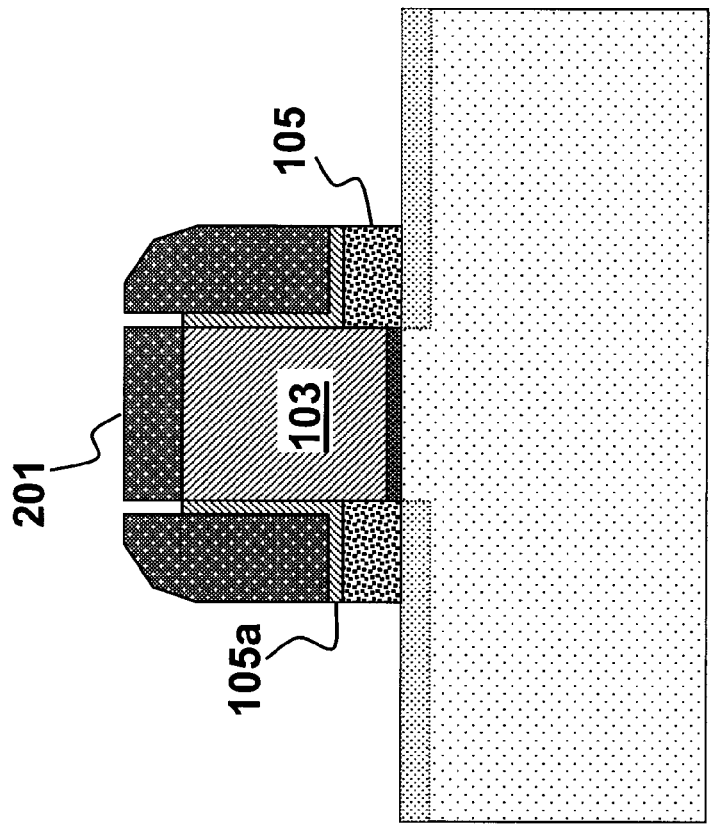
Figure 6D:
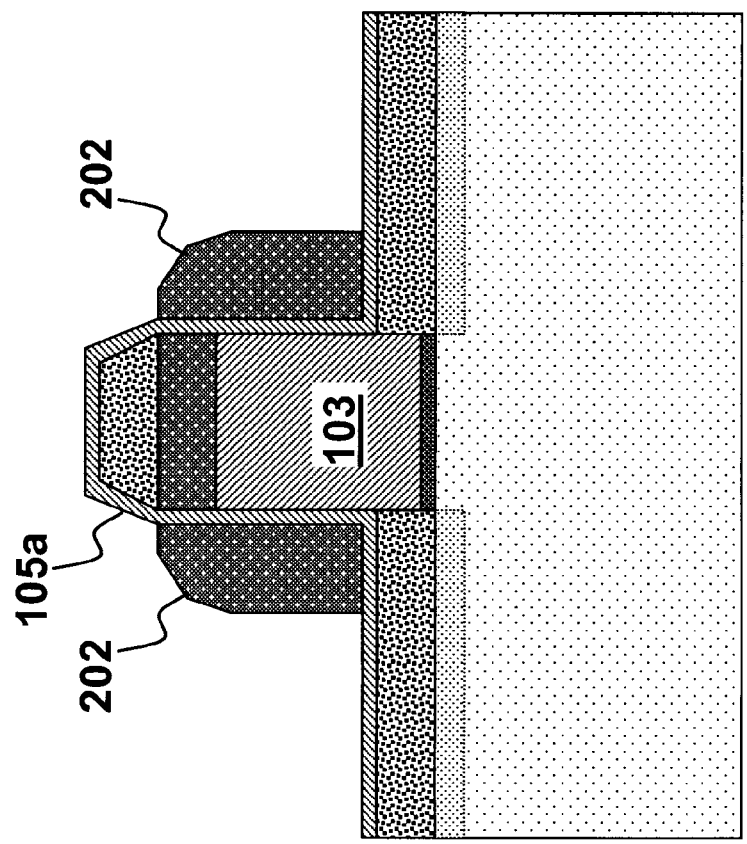
Figure 6H:
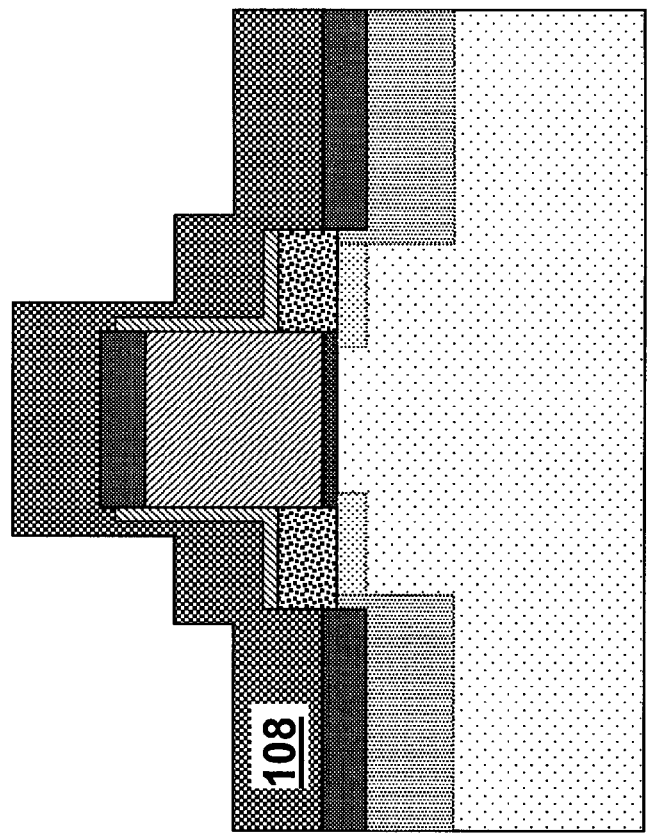
Figure 6G:
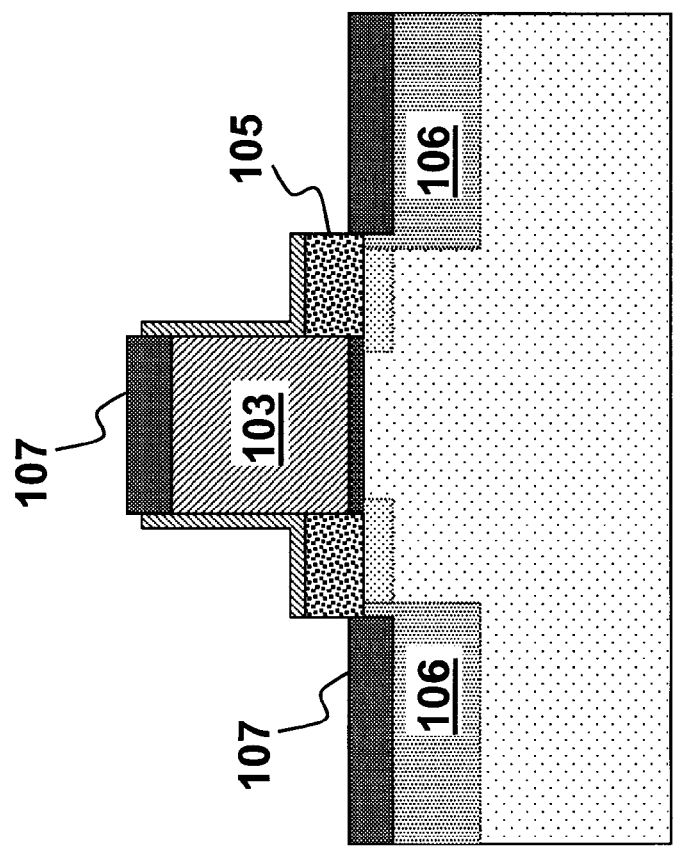

After forming silicided contact areas of source/drain and gate regions, a stress liner 108 may be deposited, as shown in FIG. 5(i), on top surfaces of silicide 107 that covers source/drain regions 106 and gate region 103, and protective blocks or plugs 105. By the virtue of removal of nitride spacers 202, stress liner 108 may now be disposed next to gate region 103, relatively close to the channel region of device 100. Stress liner 108 may be a nitride stress liner and the stress may be compressive or tensile, depending on the type of semiconductor device 100 as is well known in the art.

FIG. 5(j) illustrates a method of forming a layer of dielectric material 109, on top of stress liner 108, according to one embodiment of the present invention. Layer 109 may be an inter-layer dielectric (ILD) layer within which conductive studs may be formed to provide electrical connections to the contact areas of source/drain regions 106 and gate region 103 of semiconductor device 100. ILD layer 109 may be formed through, for example, sputter deposition or other well-known processes. As is shown in FIG. 5(*j*), embodiments of a method may also include subsequently planarizing a top surface of IDL layer 109 through for example a chemical-mechanical polishing (CMP) process to create a flat top surface, upon which photo-masks may next be created to form a pattern of conductive stud.

FIG. 5(*k*) illustrates a method of creating a photo-mask 203, on top of ILD layer 109, which represents a pattern of conductive stud such as a CA bar to be created inside ILD layer 109. However, a person skilled in the art will appreciate that the present invention is not limited in this respect and other patterns may be employed to create different conductive studs. For example, a pattern may be created that will lead to the formation of conductive studs as shown in FIG. 3.

With photo-mask 203 working as protection, selective etching may be performed to remove part of dielectric material 109 which is exposed to photo-mask 203 and create an opening 204 as is shown in FIG. 5(*l*). The selective etching may be a directional etching process of RIE, as is well-known in the art, by employing a gas mixture that provides selectivity to nitride liner 108. The gas mixture may include one or more gases of $CH_3F$, $CH_2F_2$, $CHF_3$, $CF_4$, $C_4F_8$, $C_5F_8$, $C_4F_6$, $O_2$, CO, and Ar. However, other combination of gases that provides desired selectivity of etching may also be employed. After reaching nitride stress liner 108, a second RIE etching process may be employed, this time using a different gas mixture of $CH_3F$, $CH_2F_2$, $CHF_3$, $CF_4$, $C_4F_8$, $C_5F_8$, $C_4F_6$, $O_2$, CO, and Ar that provides selectivity to oxide, to remove area of nitride stress liner 108 exposed during the first RIE process as is shown in FIG. 5(*m*).

FIG. 5(*n*) illustrates a method of performing over-etch to remove possible residue of stress liner 108 on top of silicided contact area 107 according to one embodiment of the present invention. The application of protective block or plug 105 on top thereof, source/drain extension regions 104 remain intact after over-etch of silicide 107. Next, within the formed opening 204, a conductive media such as tungsten (W) or other metal elements may be filled or deposited which creates conductive stud 110 (FIG. 1) to provide electrical connections to contact areas 107 of source/drain regions 106 and/or gate region 103. A simplified illustration of a finished semiconductor device 100 with conductive stud 110 is shown in FIG. 1.

According to another embodiment of the present invention, gate region 103 of semiconductor device 100 may be silicided preferably only at a top surface for certain applications. Embodiments of processes and/or methods of creating semiconductor devices having silicided top surface of gate region are demonstratively illustrated in FIGS. 6(*a*)-(*h*).

FIG. 6(*a*) shows a semiconductor device 300 wherein a protective layer 105 is formed on top of a shallow ion implantation layer designed for source/drain extension regions 104, as described above with regard to FIG. 5(*c*). Next, according to one embodiment, a thin layer of protective material 105*a*, for example, oxide, may be formed on top of protective layer 105 as shown in FIG. 6(*b*). This thin protective layer 105*a* of oxide may be a conformal low-temperature oxide (LTO) to provide protection for sidewalls of gate region 103. The formation of thin protective layer 105*a* provides additional flexibility for adjusting the thickness of protective layer 105. For example, the thickness of oxide layer 105 may be tailored to protect the source/drain extension regions underneath while that of oxide layer 105*a* may be controlled to be thick enough for protecting sidewalls of gate region 103 but at the same time sufficient thin as to not causing appreciable reduction in effectiveness of a stress liner, which is to be applied to induce stress in the channel region of semiconductor device 300.

FIG. 6(*c*) illustrates a method of forming one or more spacers 202 along sidewalls of gate region 103 next to protective layer 105*a*, as compared to FIG. 5(*d*). Spacers 202 may define source/drain extension regions 104 next to gate region 103 and expose the rest of protective layer 105 and 105*a* for further etching processing. A person skilled in the art will appreciate a comparison made to FIG. 5(*d*).

FIG. 6(*d*) illustrates a method of selectively removing oxide protective layers 105*a* and 105 not covered by spacers 202 by a well-known etching process, such as a reactive-ion-etching (RIE) process, leaving the remaining of protective layer 105 to form protective plug or block 105 underneath spacers 202. Protective block or plug 105 may be a layer of oxide or other suitable dielectric material. A person will appreciate that oxide plugs 105 are self-aligned to source/drain extension regions 104 underneath and defined by oxide plugs 105. Comparison shall be made to FIG. 5(*e*).

FIG. 6(*e*) illustrates that after forming oxide plugs 105, exposed areas not covered by spacers 202 may be subjected to deep ion implant to form source/drain regions 106. The formation of deep ion implantation may be followed by an annealing process which may result in a slight expansion of ions in source/drain regions 106 into source/drain extension regions 104 as illustrated in FIG. 6(*e*). Comparison shall be made to FIG. 5(*f*).

After forming source/drain regions 106 with deep ion implantation, FIG. 6(*f*) shows that nitride spacers 202 are removed so that a stress liner, to be applied subsequently, may be disposed close to a channel region underneath dielectric layer 102. Nitride spacers 202 may be selectively etched away by applying the material selectivity of nitride relative to oxide of protective layer 105*a* and 105 and polysilicon of gate region 103 and source/drain regions 106. Following the removal of nitride spacers 202, according to one embodiment, a layer of nickel silicide 107 may be formed on top of source/drain regions 106 and gate region 103 to form contact areas of device 300 by any of well-known processing techniques. As is shown in FIG. 6(*g*), since sidewalls of gate region 103 are now covered by the thin layer of oxide 105*a*, silicide 107 is only formed on top of gate region 103, as compared to wrapping gate region 103 shown in FIG. 5(*h*). Silicide 107 defines a region of contact areas with reduced resistance and/or improved conductivity of source/drain and/or gate region.

After forming silicided contact areas 107 of source/drain and gate regions, a stress liner 108 may be deposited on top of silicided contact areas 107. Stress liner 108 cover gate region 103, source/drain regions 106, and protective plugs 105. By the removal of nitride spacers 202 as shown in FIG. 6(*f*), stress liner 108, which may be a nitride stress liner and the stress may be compressive or tensile (depending on the type of semiconductor device 300), may be disposed relatively close to the channel region of device 300, by applying next to gate region 103. Subsequent operations of forming semiconductor device 300 may be similarly found in FIGS. 5(*i*)-(*n*) and therefore are not repeated herein further in detail.

According to yet another embodiment of the present invention, in stead of forming protective layer 105 directly on top of source/drain extension regions 104 as shown in FIGS. 1-3, protective layer 105 may be formed on top of a dielectric liner 108, and dielectric liner 108 may be formed directly on top of source/drain extension regions 104, as shown in FIG. 4. Embodiments of methods and/or process of forming semiconductor device 400 may be demonstratively illustrated in FIGS. 7(*a*)-(*f*) below.

FIG. 7(a) illustrates a semiconductor device structure 400 formed according to any well-known FEOL technologies. Semiconductor device 400 may be formed in a substrate 101, and may include a gate region 103 formed on top of a gate dielectric 102, source/drain regions 106, and source/drain extension regions 104 next to gate region 103. A stress liner 108, which may be a nitride compressive liner or nitride tensile liner depend on the type of semiconductor device 400, may be deposited on top of silicided contact areas 107 of source/drain regions 106 and gate region 103.

FIG. 7(b) illustrates that on top of stress liner 108, a protective layer 105 of dielectric material may be deposited. Dielectric material 105 may be a layer of oxide, deposited through, for example, the high-density plasma (HDP) process as is well-known in the art. The application of HDP process may create a non-conformal oxide layer 105 which provides a pre-determined or desired thickness on top of stress liner 108 and almost no coverage on portions of stress liner 108 next to sidewalls of gate region 103.

Figure 7D:
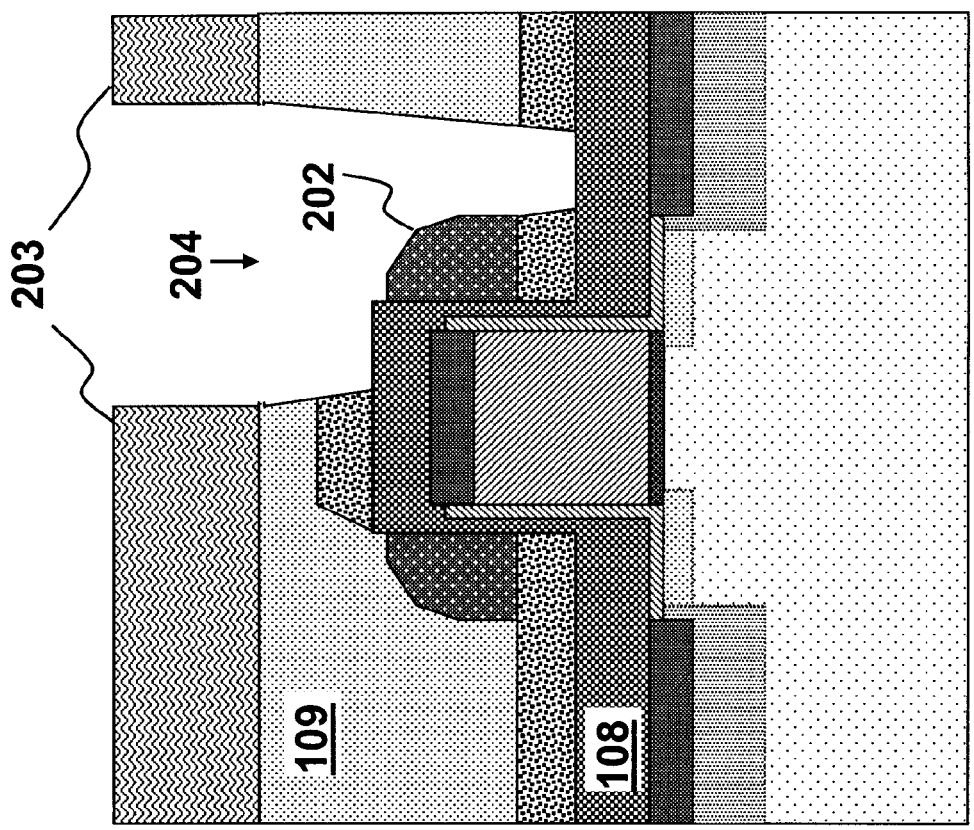
Figure 7C:
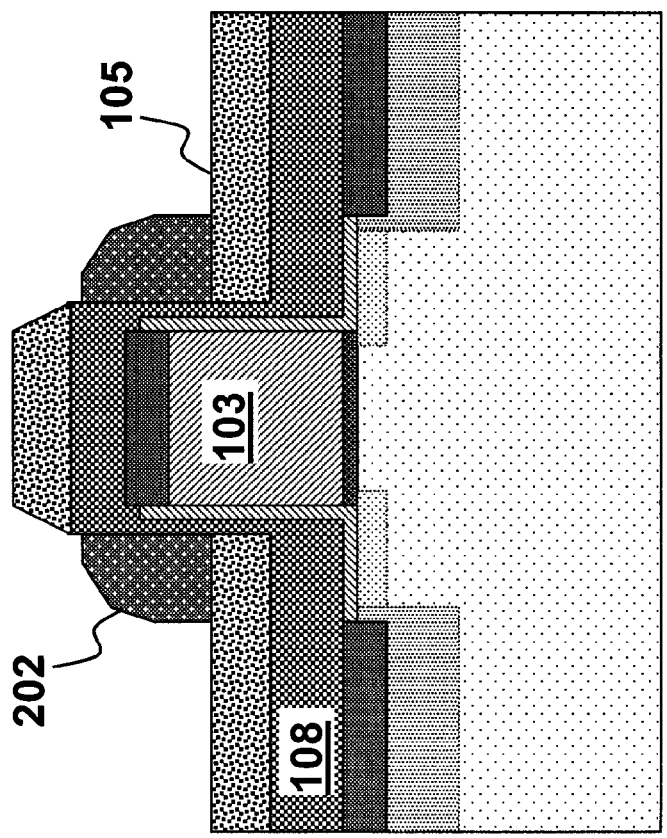

FIG. 7(c) illustrates a method of forming spacers along sidewalls of gate region 103 according to embodiments of the present invention. Spacers 202 may include materials of nitride that may be made selective to oxide of protective layer 105 during a selective etching process, such as a RIE, and may be formed by applying any of well-known processes of FEOL technologies. Spacers 202 may be sufficient wide to cover source/drain extension regions 104 underneath stress liner 108.

FIG. 7(d) illustrates that after forming spacers 202, a layer of inter-level dielectric material (ILD) 109 may be formed on top of spacers 202 and protective layer 105, and the ILD layer 109 may then be planarized. An opening 204 for forming conductive stud may be created inside ILD layer 109 and protective layer 105 by, for example, first creating a conductive stud pattern in a photo-mask 203 and then etching, through the formed photo-mask pattern 203, ILD layer 109 and protective layer 105 selective to spacers 202 and photo-mask 203 to form an opening 204. The selective etching may be performed in a gas mixture including one or more gases of $CH_3F$, $CH_2F_2$, $CHF_3$, $CF_4$, $C_4F_8$, $C_5F_8$, $C_4F_6$, $O_2$, CO, and/or Ar. However, other combinations of gases that provide desired selectivity of etching may also be employed.

Figure 7F:
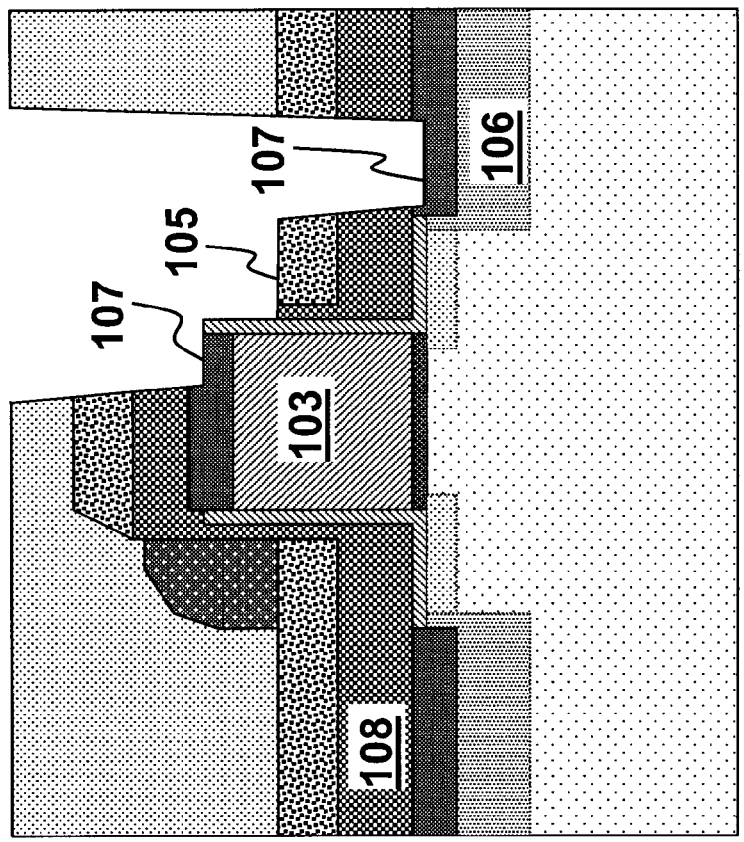
Figure 7E:
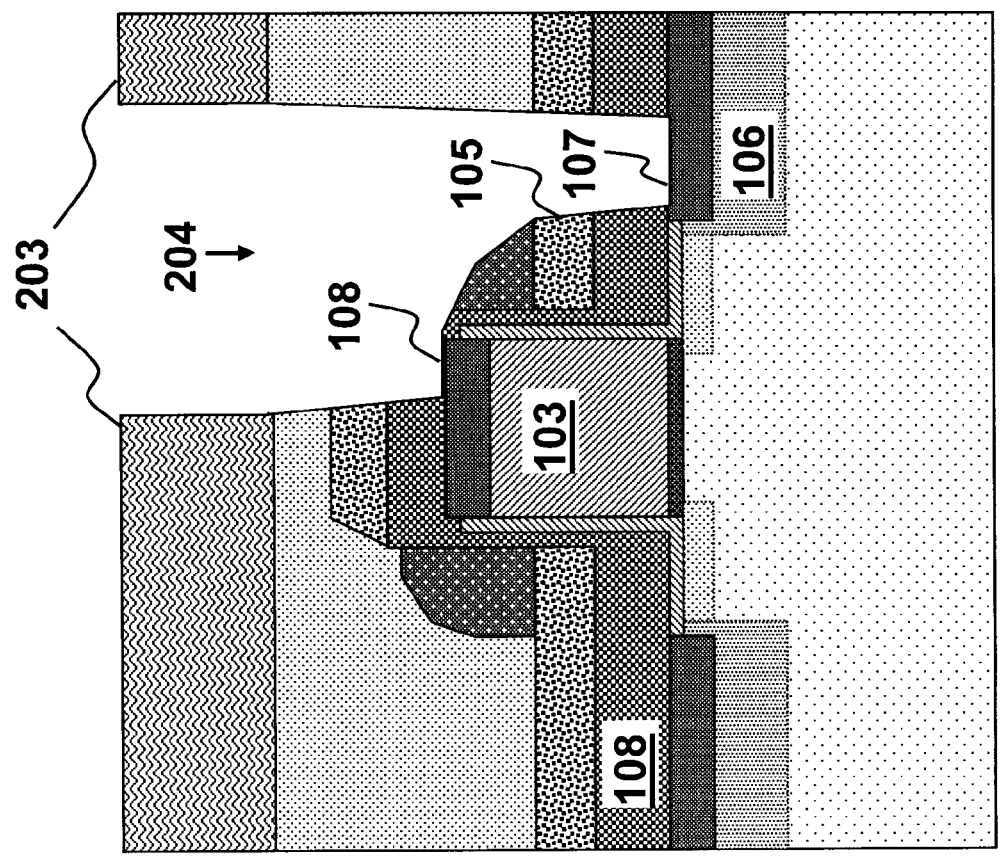

FIG. 7(e) illustrates that after creating opening 204 inside and through ILD layer 109 and protective layer 105, embodiment of the invention may include a second selective etching process, using a different gas mixture of $CH_3F$, $CH_2F_2$, $CHF_3$, $CF_4$, $C_4F_8$, $C_5F_8$, $C_4F_6$, $O_2$, CO, and/or Ar as is known in the art, that provides selectivity to oxide to remove area of nitride stress liner 108 exposed by the first RIE process as shown in FIG. 7(d).

FIG. 7(f) illustrates a method of performing over-etch to remove possible residue of stress liner 108 on top of silicided contact areas 107 according to one embodiment of the present invention. By the virtue of application of protective block or plug 105 on top thereof, source/drain extension regions 104 remain intact after the over-etch of silicided contact area 107. Next, in the formed conductive stud opening 204, a conductive media, for example, tungsten (W) or other suitable metal media, may be filled or deposited to form conductive stud 110 (FIG. 4) that provides electrical connection to contact areas 107 of source/drain region 106. A simplified illustration of a finished semiconductor device 400 with conductive stud 110 is demonstratively illustrated in FIG. 4.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of forming a conductive stud contacting a semiconductor device having a gate region, the method comprising:

forming a protective layer covering said semiconductor device and at least substantially not covering sidewalls of said gate region of said semiconductor device;

forming one or more spacers adjacent to said gate region of said semiconductor device, said spacers covering a first portion of said protective layer;

removing a second portion of said protective layer not being covered by said spacers to expose source/drain areas of said semiconductor device;

forming source/drain regions at said exposed source/drain areas;

creating said protected area self-aligned to and covered by said first portion of said protective layer;

removing said spacers covering said first portion of said protective layer;

siliciding exposed areas of said source/drain regions to form said contact area of said semiconductor device, said contact area being a silicided contact area, and siliciding a top and said sidewalls of said gate region;

selectively etching an opening down through said protective layer reaching a contact area of said semiconductor device, said opening being away from a protected area of said semiconductor device, and filling said opening with a conductive material to form said conductive stud.

2. The method of claim 1, further comprising:

applying a dielectric liner over said semiconductor device, covering said silicided contact area and said first portion of said protective layer; and depositing a layer of inter-level dielectric (ILD) over said dielectric liner, wherein said selectively etching comprises etching said openings through said ILD layer and said dielectric liner to reach said silicided contact area, with said protective layer protecting said protected area during said selective etching.

3. The method of claim 2, wherein said protective layer is an oxide layer; said dielectric liner is a nitride stress liner; and said inter-level dielectric is an oxide layer, and wherein said dielectric liner is selective to said protective layer and said ILD layer during said selective etching.

* * * * *